(12) United States Patent
Cencur (10) Patent No.: US 7,531,921 B2
(45) Date of Patent: May 12, 2009

(54) COMPACT NON-CONTACT MULTI-FUNCTION ELECTRICAL SWITCH

(76) Inventor: Marko Cencur, 1040 Avenue of the Americas, Floor 24, New York, NY (US) 10018

( * ) Notice: Subject to any disclaimer, the term of this patent is extended or adjusted under 35 U.S.C. 154(b) by 0 days.

(21) Appl. No.: 11/767,681

(22) Filed: Jun. 25, 2007

(65) Prior Publication Data

US 2008/0001649 A1 Jan. 3, 2008

Related U.S. Application Data

(60) Provisional application No. 60/805,617, filed on Jun. 23, 2006.

(51) Int. Cl.
*H01H 47/00* (2006.01)
*H02H 3/42* (2006.01)
(52) U.S. Cl. ...................................... 307/126
(58) Field of Classification Search .................. 307/126
See application file for complete search history.

(56) References Cited

U.S. PATENT DOCUMENTS 4,090,184 A * 5/1978 Hamilton, II ................. 341/22
6,750,564 B2 * 6/2004 Cencur ........................ 307/116
7,361,860 B2 * 4/2008 Caldwell ..................... 200/600
7,372,355 B2 * 5/2008 Agronin et al. ............. 337/126
2007/0291009 A1 * 12/2007 Wright et al. ............... 345/173

* cited by examiner

*Primary Examiner*—Stephen W Jackson
*Assistant Examiner*—Hal I Kaplan
(74) *Attorney, Agent, or Firm*—William J. Sapone; Coleman Sudol Sapone P.C.

(57) ABSTRACT

A compact non-contact multi-function electrical switch for use in an electrical box mounted on a wall has a one or more capacitance sensors for detecting a presence of a hand placed adjacent to the switch, as well as the directional movements of the hand along an X and/or Y axis and/or Z axis, and for generating data values, and a CPU for receiving the values and for determining which function is to be performed, such as calculating a power output in response to a first data bit. The switch can communicate with nearby switches to avoid sensor interference. The CPU can be used to generate one or more control signals for controlling the predetermined function associated with the specific movements. A processing unit may be used with multiple switches in a gang assembly, so that the switch sensors form an array enabling the switches to perform more complex control functions.

39 Claims, 7 Drawing Sheets

COMPACT NON-CONTACT MULTI-FUNCTION ELECTRICAL SWITCH

TECHNICAL FIELD

This invention relates to electrical switches and more particularly to a compact non-contact multi-function capacitance switch for control of one or more electrical circuits.

BACKGROUND

Most household or office electrical circuits, particularly those related to lighting, typically utilize mechanical switches. These mechanical switches may be of the contact type for on/off activation, or include a means for varying the power supplied to the circuit, i.e., to perform a "dimming" function, to variably alter power supplied to a light or to act as a speed control for a fan.

Non-contact switches that rely on a change in capacitance to perform an on/off function have been proposed. These devices sense the presence or absence of an object in front of the switch by the change in capacitance.

In U.S. Pat. No. 5,973,608, a non-contact switching system is described that utilizes selected components to provide on/off and dimming functions. However, the components in one embodiment are preferably housed at a centralized location, requiring dedicated wiring from the sensors to the central controller and then back to the activated circuits.

In addition, the dimming function is achieved in defined steps which require particular components for each step, further increasing costs and complexity. For example, the '608 patent uses outputs of a capacitive sensor at predetermined levels to activate different stepped levels of dimmer output. This means that the number of capacitive sensor outputs is proportional to possible dimmer levels. A digital value representing those levels is passed through a programmable logic device (PLD) and then latched. Latch output determines output power level. This means that the number of power control outputs is proportional to the output power levels. To construct a smooth dimmer, small increments in output power level are needed, which requires a proportionally high number of power control outputs, and thus multiple large components with a high number of pin counts (PLD, latch, clock chips). Even if a CPU were considered for use in the device, the input pin count would still be equal to the sensor output number and the output pin count equal to the latch output number of the CPU, which would still be proportional to the number of stepped dimmer levels, requiring a large CPU chip and numerous interconnections and peripheral components in the circuit.

Control of the '608 switch is hand movement dependent. To switch the light on, the hand must be moved from the furthest zone into the closest zone of the sensor. To switch the light off, the hand must be pulled from the closest zone into the furthest zone of the sensor. Clearly two different types of movement are needed for basic operation of the switch. To users unfamiliar with the device this could result in confusion.

In U.S. Pat. No. 5,716,129, a non-contact switch includes an oscillator having a frequency output that varies with proximity of a hand. The components are intended for insertion into a lamp base or an ornamental shell. The component count and/or component size are quite large and would not fit into a standard wall box, as is clear from the view showing these components in a lamp base, and this is without a dimmer control circuit. The device is clearly not capable of functioning as a direct replacement of a mechanical wall mounted switch. The device also requires both a neutral and a live connection to the AC power source, while in many wall boxes and circuit designs, only one lead is accessible, rendering such a device useless as a direct replacement.

A particular problem with the prior art is the inability to provide a direct replacement for a mechanical switch. For example, a direct replacement of a mechanical on/off toggle switch must be capable of fitting within a space defined by a common electrical box. Utilizing special size boxes or special wiring adds substantially to the cost of installation, and is prohibitive in any retrofit application.

In U.S. Pat. No. 6,750,564, a compact non-contact electrical switch, having the same inventor as the present application, was presented which addressed these problems. This is an improvement on the switch disclosed therein.

However, it was found that the switches described in the previous patent were somewhat difficult to mount close together in a gang installation. If they are too close, the sensor ranges may overlap and then it becomes difficult to activate just a single switch without activating neighboring switches by accident. While this problem can be overcome by reducing the sensor ranges, this may also reduce the usability of the switch.

Another problem that may occur in a ganged installation relates to the capacitive sensors. If the capacitive sensors in adjacent switches operate as oscillators, pulse generators or any other changing voltage/current method that measures sensors impedance, they can interfere with each other. Basically each capacitive sensor is an oscillator that radiates electromagnetic waves into the surrounding space. If the sensors are close together, and their frequency is similar, they can "tune" to each other, just as a radio tunes to a transmitter frequency, and when that occurs, the sensors can interfere so the switches won't work correctly. While this can be overcome by reducing the range of the sensor or by shielding the sensor field, both solutions may degrade somewhat switch usability.

SUMMARY OF THE INVENTION

It is an object of the present invention to provide a non-contact proximity type switch for controlling functions in one or more electrical circuits.

It is a further object to provide a non-contact multi-function capacitance electrical switch that has a compact integral construction, only requiring connection to conventional wire leads for mounting in new or existing wall boxes.

It is yet another object of the present invention to provide an integral compact non-contact multi-function electrical switch that has a minimum number of components to reduce costs and improve reliability.

It is yet a further object of the present invention to provide a single non-contact electrical switch that can perform more than one function, in response to hand movements in different directions and to different positions of the hand.

It is yet another object to provide a non-contact electrical switch which is suited to multi-gang operation, allowing multiple non-contact switches, each with either single or multiple sensors, to work in close proximity, with communication between the switches avoiding the sensor range overlapping problem discussed above.

It is another object to provide a gang assembly of non-contact electrical switches having capacitive sensors which work as oscillators, pulse generators or any other changing voltage/current method that measures sensors impedance, with communication between the switches for synchronizing frequencies and phases to eliminate interference with each other, to permit sensors with very long ranges to be used close together.

It is yet a further object of the present invention to provide a multitude of non-contact switches (i.e., a multi gang installation) which communicate with each other for performing more complex functions than could be achieved with a single unit, in particular, to provide an effective use of multiple single sensor switches in close proximity.

In another embodiment, the non-contact electrical switches mounted in gang installation can be programmed to "predict" or even "learn" a users' intentions, based on information derived from the neighboring switch sensors. For example, when a user seeks to activate a middle switch by holding the hand on the middle switch, but because the switches are close together, part of users hand reaches in the neighboring sensor ranges. If there were no communication, the other switches would activate as well. But if the sensor information from all the neighboring sensors is considered, a processing unit can decide or even learn from past experience that only the middle switch was meant to be activated and override the operation of the adjacent switches.

These and other objects of the present invention are achieved by a non-contact multi-function electrical switch for use in an electrical circuit for controlling at least one electrical device comprising:

single sensor switches improved by having communication means to be able to be gang-mounted, the communication means eliminating the above mentioned sensor overlap and inter-sensor interference;

switches with two or more sensors to add functionality to the single switch, the multiple sensor switches also using communication means for allowing gang mounting by eliminating sensor overlaps, as well as to connect a multitude of single or multiple sensor switches into networks to perform more complex functions;

a central processing unit (CPU) connected to the sensors and having means for receiving signals therefrom, and for processing the signals to generate one or more output signals, and having signal processing means for receiving the one or more output signals and for determining which functions are to be performed, the signal processing means generating one or more control signals in response to the sensors input, the control signals received by means for controlling the function identified by the signal processing means in the at least one electrical circuit.

The means to communicate in either the single or multi sensor units are used to communicate with the CPU, with nearby switches, or both, the communication enabling the switches to co-ordinate and thereby eliminate sensor overlaps, sensor interference and to enable multiple switches to perform more complex functions, such as operating multiple devices, by connecting them together in a network.

In one embodiment, for one function, the output signal may generate a triac firing pulse, a delay between the AC period zero crossing and the firing pulse determining the quantity of power delivered to the circuit. That is, one function may be to calculate a power output relative to the AC period zero crossing, generating a control signal used for controlling power in the electrical circuit. Another function may be to activate a second light fixture or to power another circuit. Instead of a triac, various other semiconductor elements such as transistors could be used, which are not pulse triggered.

Preferably, the non-contact electrical switch includes an interference detector which generates a signal that is received by the CPU to avoid inadvertent activation and/or to zero out electromagnetic and line interference, for example caused by lightning, faulty electrical appliances, etc.

The inventive switch uses a plurality of capacitance sensors to control the various functions, such as the power supply to the electrical circuit. The capacitance sensors detect the presence of an object in front of the switch, relative to the objects X, Y and/or Z position as well as relative movement in the X, Y and/or Z directions, the movement being relative to the individual sensors, for performing functions such as turning the power on/off, performing a dimming function, activating circuits in a particular sequence, etc. Each sensor reacts to the change of capacitance, caused by the change of dielectric constant of the medium in front of the individual sensor, outputs of the multiple sensors are compared and position, direction, and orientation of the object, as well as specific movement directions can be interpreted by the signal processing means to generate a preprogrammed output in response.

For example, locating two sensors, one above the other, single dimensional hand position and movement, up/down or side to side, can be interpreted by the processing unit. Such movements could be interpreted as lowering or increasing the lighting level.

Mounting a third sensor, to one side of two sensors mounted one above the other, adds another dimension of position and movement that can be interpreted, so that the processing unit obtains changes in both up/down and side to side movement, enabling the signal processing unit to determine the complete X-Y position and movement of the object in front of the sensors. Different movements or hand positions in X and Y directions could generate an appropriate response, such as activate a second circuit.

The proximity of an object along a Z direction could be determined from the absolute signal strength of the individual sensors, while the X and Y coordinates would be calculated from relative signal strengths of individual sensors. For example, if an upper sensor signal would be twice as strong as a lower sensor signal, the software would calculate the objects Y coordinate being closer to the top of the switch. If for example both sensor signals would increase, but keep the original ratios between them (2:1) the software would calculate the Y coordinate to be constant, but the objects Z coordinate would be closer to the switch, assuming the sensor signals increase with the object closer to the sensor, and correspondingly, should the signals decrease, the object would be moving away. If the sensor signal would decrease with an object approaching, opposite coordinate changes would be calculated, but the principle remains the same.

Figure 1A:
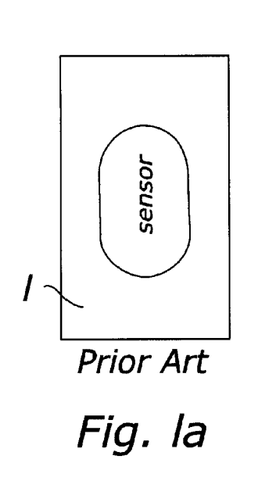
FIG. 1a is a schematic of a prior art integral non-contact electrical switch having a single sensor, FIG. 1b being a view of the inventive switch with two sensors, and FIG. 1c being a view with three sensors.
Figure 1B:
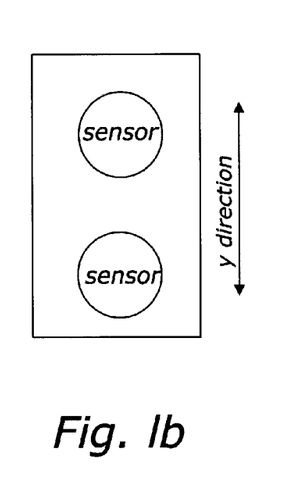
Figure 1C:
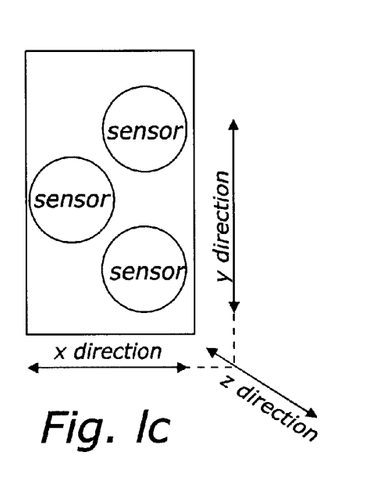

Many different positions of 2, 3 or more sensors are possible, other than those depicted on FIG. 1b, 1c, such as triangle formation, square formation, different distances between them etc. Several single and/or multiple sensor switches could be mounted in close proximity, in a multigang configuration, to provide a sensor array, with the switch sensors interconnected directly, to communicate with each other, or can communicate to a processing unit that can be programmed to respond to various combinations of sensor output to perform different functions. This can, of course, go beyond lighting, to activate various devices, and these switches and their ease of array configuration are uniquely adapted to working in a "smart" home or business environment, particularly since they provide fairly sophisticated positional information to the processing unit, and correspondingly, the processing unit can perform fairly sophisticated control of various functions, just with the wave of a hand. Using the present invention, this can include a simple multigang installation containing single sensor switches, or multiple-sensor switches or combinations thereof.

Using the applicants' invention, many functions can be performed with a single multi-sensor switch, using relatively simple hand movements, yet the switch can still fit within a typical wall box. The switch reacts on capacitance changes rather than on fixed capacitance values, so environmental factors (such as dust, decorative wall plates in front of the sensor) are calibrated out and do not interfere with accurate interpretation of the various hand movements and with generating distinct control signals. Advantages of such a design over prior non-contact switches such as capacitance, infrared, sound, light sensor, movement detector etc. are:

1) Switch control is independent of the front plate material, color, shape etc., as there is no need to conduct a physical contact control signal via a conductive element (for example as with a touch plate sensor);

2) There are no accommodations necessary to accept mechanical limitations to the front plate design as there are no moving parts, unlike mechanical toggle switches and mechanically controlled dimmers;

3) The capacitance sensors can penetrate through various materials, so there is no need for an opening in the front plate for the sensors to operate, unlike infra-red or various sound, light, and motion sensors;

4) The front plates are freely interchangeable since the switch is capable of re-calibrating to each new material fixed in front of it;

5) The switch is immune to dirt or grime on the front plate, unlike touch plate sensors, IR and other optical sensors, since any amount of dirt is treated by the capacitance sensors as a fixed object and calibrated out;

6) The switch can be completely sealed since it doesn't incorporate any mechanical moving parts, unlike mechanical switches and mechanically controlled dimmers, which also increases reliability; and, 7) The operation of the switch is completely spark-free.

A wide range of front plate designs from simple plastic to artistic ceramic could be used with the switch. All natural materials such as stone, crystal, wood etc. or other materials such as plastics, glass, ceramics, rubber etc. could be used for the front plate. There are virtually no limitations except as to maximum combined weight. The switch can be used with various front plate designs purely for decorative or aesthetic reasons, but it could also be used when physical contact with a switch is not desired, for example, when operating a switch in a hospital, public lavatories etc. or where the environment contains dust, dirt etc that may accumulate on the front plate. Since the switch can be sealed, it can also be used in harsh environmental conditions such as when exposed to the elements, to mist or fumes etc., and thus it is applicable to outdoor and/or industrial uses.

The switch can directly replace a standard household wall switch. That is, it can be fitted into an existing wall box of standard dimensions and be connected to the existing wiring, allowing direct retrofitting in existing electrical circuits. The switch can be connected either in series (i.e. a two-wire connection) as a direct replacement of a regular wall switch where only a single lead is accessible, or in parallel (i.e. a three-wire connection) if the load requires such connection and the wires are accessible in the wall box. The switch can be provided as a full range smoothly operated multiple dimmer control, or as an on/off switch, among other functions.

The switch can readily be designed to meet all international standards. Because it is of compact integral construction, substantial space remains in the wall box beyond that needed by the switch itself, so there is enough room left in the wall box for wiring. In addition, a metal cooling surface or other heat sink can be incorporated into the switch so as to comply with various heat dissipation standards.

Another advantage of the present invention is that it does not use absolute predetermined values of capacitance to control the switch. With the '608 patent device, to turn the switch fully on, the hand has to come into the closest zone to the sensor. Since this zone is fixed, it could be inside the wall, for example if the sensor is mounted too deeply into a wall recess or if the sensor is covered by a cover plate that is too thick. In both cases it would be impossible to turn the switch fully on since the closest sensor zone would be inaccessible. A similar problem could occur if a permanent conductive object were mounted near the '608 sensor. This surface would distort the electrical field of the sensor resulting in reduced sensor sensitivity, as zones become closer to the sensor surface. Both problems could possibly be overcome by setting the sensor parameters manually or automatically. If the sensor parameters are adjusted manually, each user of the switch would be responsible for these settings, which is a significant drawback since this would complicate installation. For automatic sensor adjustment, special circuitry must be added to the sensor since the '608 device is not capable of auto-calibration, increasing component count and overall device size and complexity.

In the inventive switch, this problem is solved by reacting on the capacitance change rather than on the absolute value. The flag for detecting the presence of an object is set when capacitance in front of the sensor is increased. There is no fixed predetermined level at which presence is detected. By this the switch is also self-calibrated, as it cancels out any permanent capacitance changes in front of the sensor. This auto-calibration may be implemented completely in software without any increase in component count or in the size of the inventive switch.

The present invention operates independent of hand speed and no special moves are necessary in front of the sensor to activate the basic function of the switch. It always changes the state if the hand is put near the sensor, and then after, particular directional movements of the hand and positions of the hand can be programmed for activating particular functions, i.e., up for increasing power, down for decreasing power, left to right to activate a second circuit, right to left, to deactivate the second circuit, etc.

DETAILED DESCRIPTION OF THE INVENTION

To construct the inventive switch for use in a standard wall box and to meet all international standards, the switch must be as compact as possible. The number and size of components must be minimized, as well as the number of data lines between elements of the circuit and the space occupied by inter-component connections to reduce the number of chip-pin count, reducing chip size.

Some of the elements used in the switch (triac, snubber capacitor for triac, filter choke, power supply, fuse) are basic and are conventionally used in many types of electronic devices. Since they are quite bulky, they also would normally decrease useful space for specialized electronic parts such as the capacitive sensor, control circuitry, back lighting, etc.

Previously, it was thought that to achieve a compact integral design, it was necessary to detect only the presence of an object such as a hand placed in front of the sensor rather than its position relative to the sensor. This produced only one bit of input data, referred to as a "flag". Control of power delivered by the switch was accomplished via a delayed triac trigger pulse, so the output data consisted of only one output bit. While this results in a very compact design, using only three data bits, the input from the sensor, output to the triac and an input from an AC zero detector, independent of a dimmer level count, it was determined that multiple inputs can be accomplished in a compact integral design, using multiple sensors, with proper programming of the signal processing means.

Referring to FIG. 1*a*, a schematic view of a non-contact switch 1 is shown, which utilizes a single sensor, as described in U.S. Pat. No. 6,750,564. FIG. 1*b* is a view showing a two sensor arrangement, the sensors mounted along a Y axis, so that changes in hand motion, in an up or down motion can be detected. FIG. 1*c* is a view showing three sensors. This can provide multiple functions based on particular movement combinations. The three sensor embodiment provides information as to hand movements in/out, and out/in, relative to the sensors, up/down, down/up, and left/right and right/left. Thus movement in these different dimensions can be interpreted by the signal processing means to on/off control one or more circuits, control dimmer functions, and to perform other related pre-programmable functions.

Figure 2A:
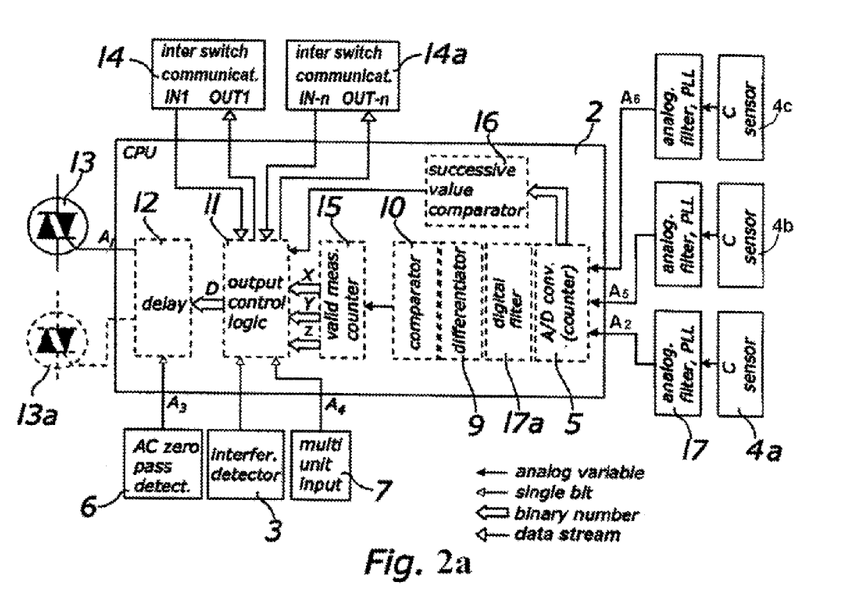
FIG. 2a is a block diagram showing the components of the non-contact multi-function electrical switch, FIG. 2b being a block diagram showing an alternative for inter-switch communication.

Referring to FIG. 2*a*, the non-contact switch circuit is shown divided into several functional blocks.

A CPU 2 is the central block and has, by way of example, eight inputs and four outputs, one being in phantom as an option.

Pin $A_0$ is connected to the interference detector. If the interference is detected, the value obtained by the CPU is discarded or corrected.

Pin $A_1$ is an output which generates a triac firing pulse. A delay (or time passed) between AC period zero crossing and the firing pulse determines a power delivered to a load. If the delay is zero, power is maximal. If the delay is ½ of AC period, power is zero. In practice both extreme values for the delay are not used. If the triac is not fired (firing pulse is absent) the power delivered to a load is zero. By this the switch is turned off. While a triac is discussed, it will be understood that other elements could be used instead of a triac, such as various types of transistors or other semiconductor elements, relays (43, 43*a* as shown in phantom in FIG. 2*b*), etc, that are not pulse triggered. Instead of a power element incorporated in the switch, a special signal may optionally be transmitted via wires or wirelessly to a central unit that could switch the power, rather than having the switch perform this function. Output $A_1$ could be used to generate such an output signal.

Pin $A_2$ is an input from the sensor 4*a*, fed to a counter 5 in the CPU 2 which counts pulses in a predetermined fixed time. By this, a frequency of a sensor output is converted into a binary number. Another way to convert sensor output frequency into a binary number is to count pulses of predetermined frequency within each period of the sensor signal, and the invention is not limited to one method of conversion.

Pin $A_3$ is an input from a AC zero crossing detector 6. Via this input, the CPU is synchronized with the AC period, though when used with DC low voltage or a relay, this input $A_3$ is not needed.

Pin $A_4$ is an input, optionally used when a multiple unit input circuit 7 is used to connect multiple units to control a single load. One switch is made master to control the power to the load, the other switches being slaves connected to this master input.

Pin A5, and A6 are inputs from the sensors 4*b* and 4*c* which are also fed to the counter 5 in the CPU 2 which counts pulses in a predetermined fixed time, and these can be compared relative to the inputs from each sensor. The outputs of the analog signal processing block are multiple digital numbers, corresponding to the different coordinates of an object (labeled X, Y and Z), detected in front of the switch, instead of a single bit flag, detected by a single sensor. This data can then be used to control multiple loads with a single switch unit, such as the additional triac shown as 13*a* or to manipulate power to single or multiple loads in a more complex manner.

The inputs from the sensors 4*a-c*, which may be one or more analog signals, are converted in the A/D converter 5 to one or more digital values. The digital values are passed through a differentiator 9. Because of the differentiator, the switch only reacts on capacitance changes, the differentiator canceling out any permanent objects in front of the sensor, thereby providing a self-calibration of the switch.

If for example the hand is in front of the sensor for several minutes, the switch only reacts to it for several seconds. The differentiator time constant determines how long the switch reacts to the fixed hand. If the constant is increased, the switch reacts longer to the fixed object and vice versa. After that, the switch is recalibrated to a new value and stops reacting. The switch will only react again if the hand is removed and then put in front of the sensor again or if another object is added to the hand in front of the sensor. Two different time constants can be utilized in the differentiator, one for when the input value is increased and one for when the input value is decreased. The differentiator reacts differently when the object is put in front of the sensor and when it is removed. When a fixed object is put in front of the sensor, the first time constant determines for how long flag f will be set i.e. the time for the switch to calibrate when an object is put in front of the sensor. The other time constant determines how long it takes for the switch to recalibrate when the object is removed. Both constants could be equal but sometimes it may be preferred that the second time constant be much lower than the first one so that the switch is calibrated more slowly if the hand is put in front of the sensor, giving adequate time to activate and operate the dimmer. When the hand is removed, the switch is calibrated much faster and full differentiator output swing is available when the hand is put in front of the sensor again. Since the differentiator is made in software, various algorithms could be used to calculate the differentiator output to optimize the switch operation.

The outputs of the differentiator are then passed to a comparator 10, which compares the outputs of each sensor and calculates the X, Y and Z positions of the object in front of the sensors. These outputs are then fed to an output control logic component 11. This logic component calculates the power to be applied as a function of values for X, for Y for Z, or combinations thereof, or whether an alternate function is to be performed. By way of example, the output of this component is a digital value D, which determines the power delivered to the load or function to be performed. For example, if the output value D is to be used to control power via triac, it is fed to a delay counter 12. This counter is synchronized with the AC period via the zero cross detector, to generate a time delay after AC period zero crossing which is proportional to the digital value D. This delay determines the amount of power delivered to the load. If the delay is zero, the power is maximal, if the delay is ½ of AC period, the power is zero. The output from the delay control controls one or more triac's 13, and 13a. There are many possible algorithms for calculating the value D.

There is no need for the delay timer, if a relay is used or if the switch is used in a low voltage DC application or when the switch is used as part of a controlled system, providing only control signals to the central control unit, and this change may be incorporated in software for the CPU, so this alternate embodiment would not change chip size or component count.

The AC zero pass detector is used to synchronize the CPU with the AC period. The CPU detects a period zero pass by detecting a transition on the $A_3$ pin. Of course, there are many possible zero detector topologies known in the art which can be used in the inventive switch.

The switch of the present invention may be powered from any source, and is not limited to AC line power. It can also be used in low-voltage systems, both AC and DC, as in a DC power system, an internal timer/oscillator/PWM can be used to control the power to the load.

To communicate with neighboring units, the switch has additional inputs and outputs. The communication is two way, that is, one switch can both send and receive data to/from any neighboring switches. Thus both input and output lines are used, for example, as labeled IN1, IN-n, OUT1, OUT-n on FIG. 2a. The switch may communicate with at least one neighboring switch, but in a ganged assembly, the switch can communicate to at least two of its neighbors, to the left and right for example. Note that in FIG. 2a, only two sets of inputs and outputs are dedicated to inter-switch communication are shown, first noted as 14 with IN1 and OUT1, second noted as 14a with IN-n and OUT-n. While this illustration shows that the switch is capable of communicating with only two neighboring switches, in practice, the number of input/output sets dedicated to communication with neighboring switches is not so limited.

The data is transmitted and received through these lines via a serial protocol, preferably using protocols capable of using just one line to transmit and one line to receive, without dedicated synchronization lines. Various serial communication protocols could be used both proprietary or industry standard and the invention is not limited to one of them.

Figure 2B:
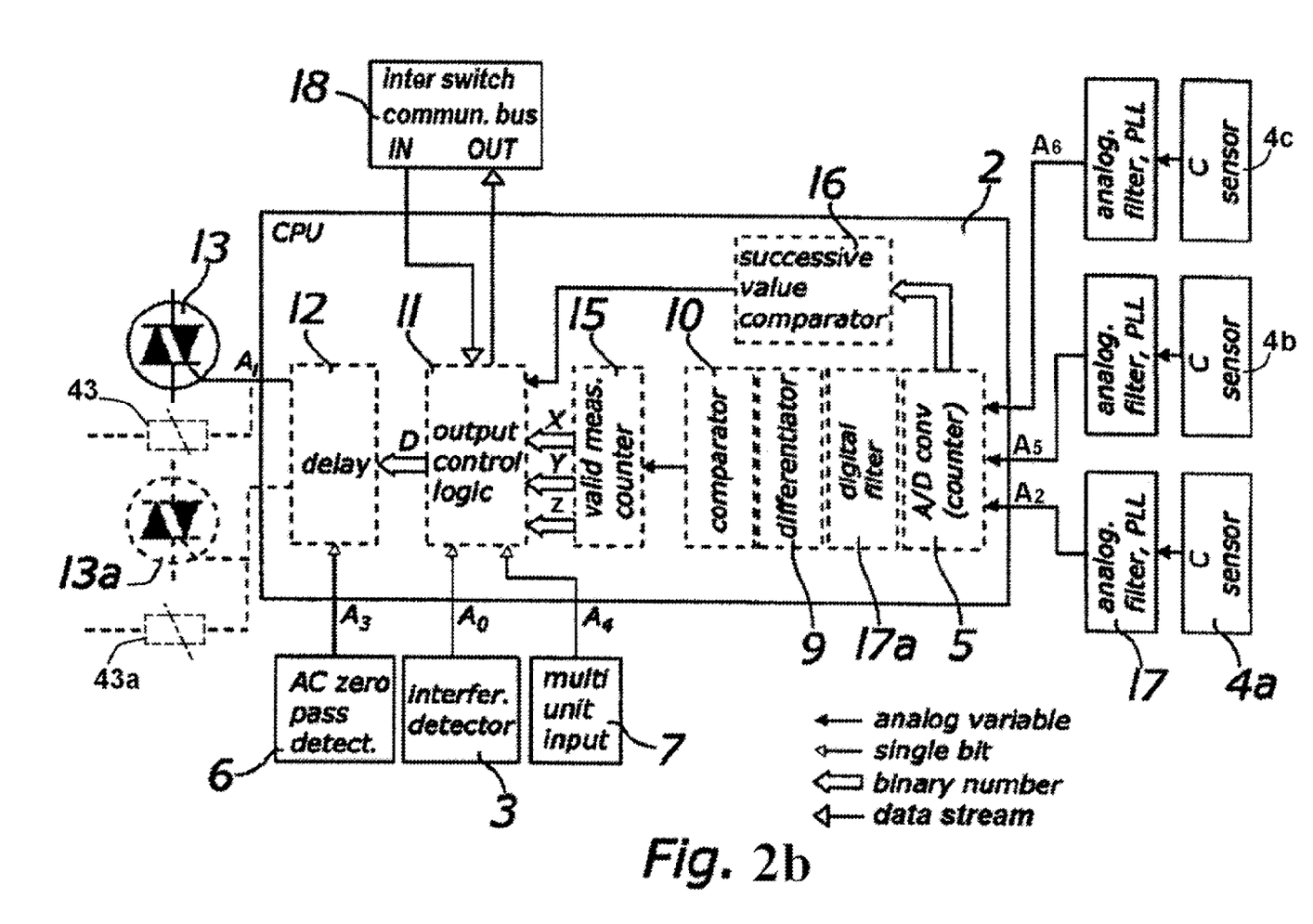

FIG. 2b illustrates an alternative means for communication with neighboring switches where only one input output pair is used to communicate to a multitude of switches via a common inter-switch bus 18. Alternatively, when different serial bus interfaces are used, more than the two pins shown on FIG. 2a could be used and even bidirectional pins, that is, pins that can be used both as input and output, can be used. Various bus protocols could be used both proprietary or industry standard and the invention is not limited to one of them.

Regardless of which protocol, method or principle for inter switch communication mentioned above is used, various hardware connections between the switches can also be used. They include but are not limited to: dedicated wire connection, galvanically insulated connection via optocoupler or signal transformer, wireless via IR or radio frequency, etc.

Figure 3A:
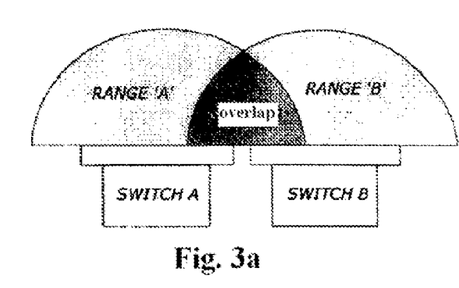
FIG. 3a is an illustrative view of a ganged arrangement of two non-contact electrical switches, showing an overlapped sensor area, FIG. 3b being a view of the switches with the overlap area being eliminated.
Figure 3B:
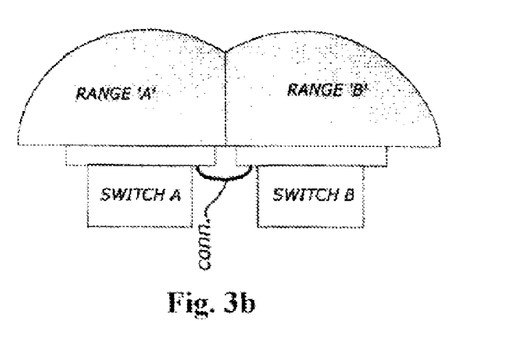

By providing for inter-switch communication, switches can share information such as: sensor values, power output status, interference detection values and many other internal variables. In this way, the switches can be made aware of the neighboring switches internal status and can act accordingly. This information is used primarily for (but not limited to):

Elimination of overlap zones: Since each switch knows the value of a neighboring switch's sensor status, a switch can identify which sensor is outputting the larger signal relative to the other switch sensors. Only the sensor with the larger output signal would trigger the switch, the other switches would be blocked from operating, including when the sensor output would be high enough to trigger the switch. The areas of activation would therefore not overlap, as shown in FIG. 3b, yet there is still complete coverage in front of the switches. More complex algorithms than just comparing the values could also be used to eliminate overlap zones.

Sensor synchronization: The communication can be used to synchronize periodical events that are used to measure capacitance (such as oscillations, pulses etc.). The synchronization can be achieved by sharing internal timing variables or even by timing of the transmitted data.

Complex functioning: Since switches can exchange information and cooperate, they can be programmed to perform more complex functions than single switches without such communication could perform.

Figure 2C:
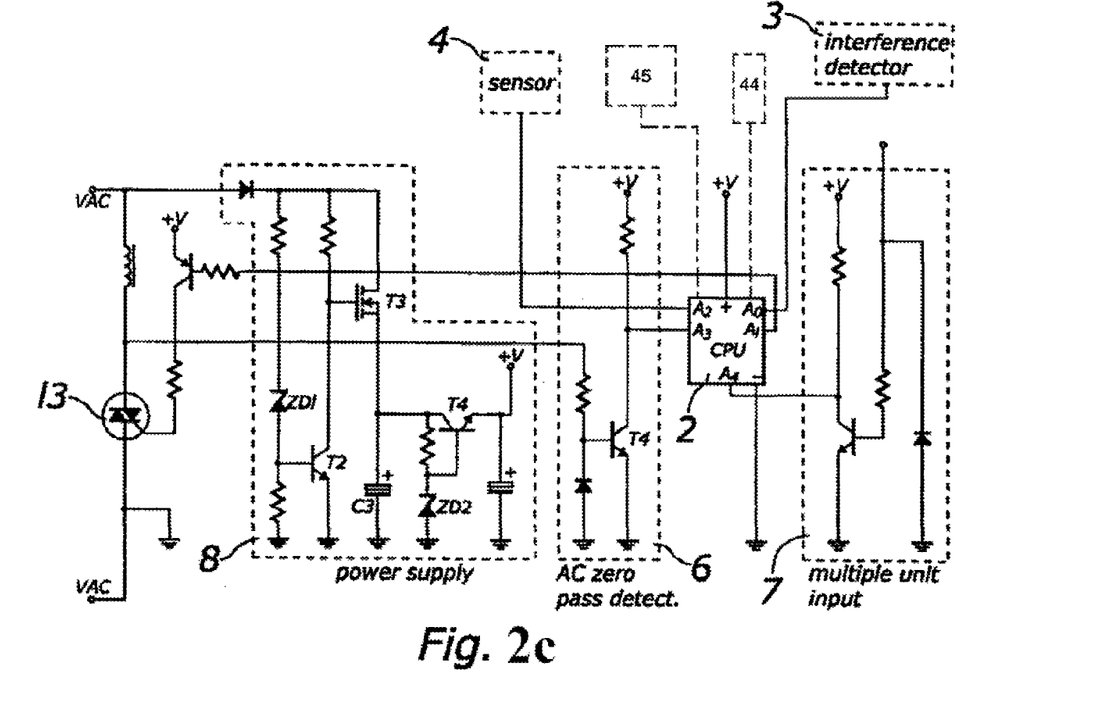
FIG. 2c is a schematic of one embodiment of the electrical switch of the present invention.

Referring to FIG. 2c, the power supply unit, illustrated as block 8 is used to supply power to the switch circuit. There are also many possible topologies for this, and any of these can be used provided that enough power is supplied to the switch for continued operation in the worst case scenario, such as when the unit is connected in series with the load and the switch is turned fully on and AC line voltage is minimal. The power supply unit has to provide power when the switch is connected in either parallel (three-wire connection) or series (two-wire connection). When connected in parallel, the power is obtained directly from the AC power source with a separate power connection. When the switch is connected in series with the load, the power is derived from the voltage drop on the triac. When the switch (triac) is fully on, the voltage drop on the triac is very low. Obtaining enough voltage from voltage drop on the triac could be difficult when the switch is connected in series with the load and turned fully on, which is the way the vast majority of normal household switches are connected. Consequently, a preferred power supply unit is configured as follows. If the AC line voltage is a positive half-wave and below 15V (or some other predetermined low voltage), a transistor $T_2$ is closed, leaving a gate of $T_3$ on a positive potential. $T_3$ is in a conductive state, connecting a capacitor $C_3$ to the line voltage and charging it. When the line voltage increases over 15V (or some other predetermined low voltage), a zener diode $ZD_1$ conducts, and $T_2$ closes. This connects the gate of $T_3$ to ground, and $T_3$ stops conducting. In other words, when the line voltage is a positive half-wave, and lower than 15V, the capacitor $C_3$ is connected to the line voltage and charged. When the voltage increases over 15V, $C_3$ is disconnected from the line voltage. The voltage on the capacitor $C_3$ is further regulated by $T_4$ and $ZD_2$.

This supplies a smooth constant voltage with low AC line voltages even when the unit is connected in series and turned fully on. Another advantage is that it avoids large high voltage capacitors or large high wattage resistors, as would typically be found in such a circuit, thus keeping the overall size of the switch small and compact. Such a power supply could also be used to supply current large enough to drive LEDs or small light bulbs for back-lighting the switch plate. Of course, other topologies could be used to directly couple a capacitor to the line voltage and charge it, while the line voltage is low enough. Other conventional methods could be used to generate supply voltage when the switch is used with different power systems such as low voltage AC or DC.

The interference detector 3 may be a simple two state circuit (flip-flop) that is reset by the CPU (when $A_0$ is set as an output) and set by any eventual line or EM interference. The output of this circuit can be read by the CPU (when $A_0$ is set as an input). If this circuit detects interference in the CPU sensor signal measurement cycle, the value obtained by this measurement can be inaccurate. In other words, if this block detects interference when the CPU is measuring the sensor input signal, the CPU discards the measured value. Many other interference detection methods to detect interfering electromagnetic activity can be used. The interference detector improves noise immunity, but this is optional for the switch operation since purely software routines can be incorporated in the CPU to improve noise immunity.

Some possible software routines that can be incorporated in the CPU to improve noise immunity include:

Counting 'valid' measurements: Values X, Y and Z are used only after a predetermined number of 'valid' measurements, performed in valid measurement counter 15. The measurement is 'valid' if it is similar to previous value. This means that some number of measurements must be similar for the value to be actually used. If several 'valid' measurements in series would be used, one or more non-repetitive erroneous sensor measurements due to temporary interference would be eliminated.

Eliminating measurements that differ too much: An object such as a hand is moved towards the sensor in a finite time. This time is usually much larger than the time passed between two successive measurements. Therefore, many measurements will be taken for a single hand movement even when the hand is moved quickly. Consequently, the series of measured values could be compared to each other to detect an anomaly in a comparator 16. For example, if the hand moves incrementally between measurements, the sensor output should only change by a correspondingly small increment. If the difference between a previous measured value and a current measured value is too large, for example, increasing by 100% as opposed to an expected incremental change of 10%, the large difference is interpreted as interference and the current value is discarded.

Filtering: Another method for reducing noise interference is to place an analog filter 17 between the sensor output and the CPU input, to remove temporary variations in the analog signal, to smooth out the signal. The type of filter depends on the type of analog signal used for the sensor output. In the case of a frequency sensor output, a band-pass filter or PLL (phase locked loop) could be used. In the case of a DC voltage signal, a low pass filter could be used. This filter could be implemented as a digital filter 17a inside the CPU, located between the AD converter and the differentiator as shown in FIG. 2b. Of course, digital implementation of the filter or PLL does not increase component count or switch size.

The multiple unit input optionally allows multiple switch units to be connected to control a single electrical circuit, for example, a room light. One switch is made master for controlling the light, other switches act as slaves connected to the master. Slaves only pass information about slave sensor status to the master and do not control the light directly. This may be used in a room with multiple doorways, the master located by one door and the slave units located by the other doors. The illustrated multiple input block 7 in FIG. 2c performs simple signal conditioning, as the signals from the slave units are fed to the CPU. This is of course optional for switch operation, but illustrates the flexibility in use and control achieved by the inventive switch which has enhanced functionality over prior art switches.

In one embodiment of the invention, a slave unit can be connected to the master via a two wire connection, one wire connected to the multiple unit input, multiple slaves connected in parallel on the same two wires. The slave(s) can receive power and send sensor information via this single pair of wires. Using only two wires enables replacement of multiple switches which control the same load using existing wiring. No additional wiring is required.

The sensors (4a-c) provide analog signals related to the dielectric constant of the medium in front of the sensor. If the dielectric constant is changed, the signal changes correspondingly. These changes are compared to one another to determine the position and direction of movement along the X, Y and/or Z axis. Changes should of course be large enough to be measurable. In a preferred embodiment, the sensors are oscillators with an output signal frequency inversely proportional to the dielectric constant of the medium in front of the sensor. Other types of analog signals could also be used (frequency, DC voltage, pulse width, etc.)

Optionally, back-lighting LED's or low power light bulbs, or electroluminescent elements could be added to the switch to back-light the front plate from behind. The LED's or light bulbs could be of different color and could vary in intensity. The function of these LED's and light bulbs could be purely decorative or be used to indicate various switch functional states, or both. For example, blue, red and green LED's could be mounted behind the front plate. As these LED's would vary in intensity, an entire spectrum of color combinations can be achieved. Different colors can correspond to different dimmer settings or the color can slowly change by it self for decorative purposes. The front plate can be transparent or semi-transparent to show these color variations through the front plate, or can have openings or windows through which the light would emerge. Various effects can be achieved by this method. If the front plate is made for example from materials which reflect light in an interesting way (for example using some transparent crystalline structures), this would have an effect of the front plate changing its color across the entire color spectrum. By choosing mounting locations, number and color of these LED's or light bulbs, combined with numerous front plate materials and shapes, infinite combinations of effects can be achieved. Of course, a single LED or light bulb can be used in this way to back-light the front plate of the switch when the switch is off to mark the location of the switch in the dark.

Figure 4:
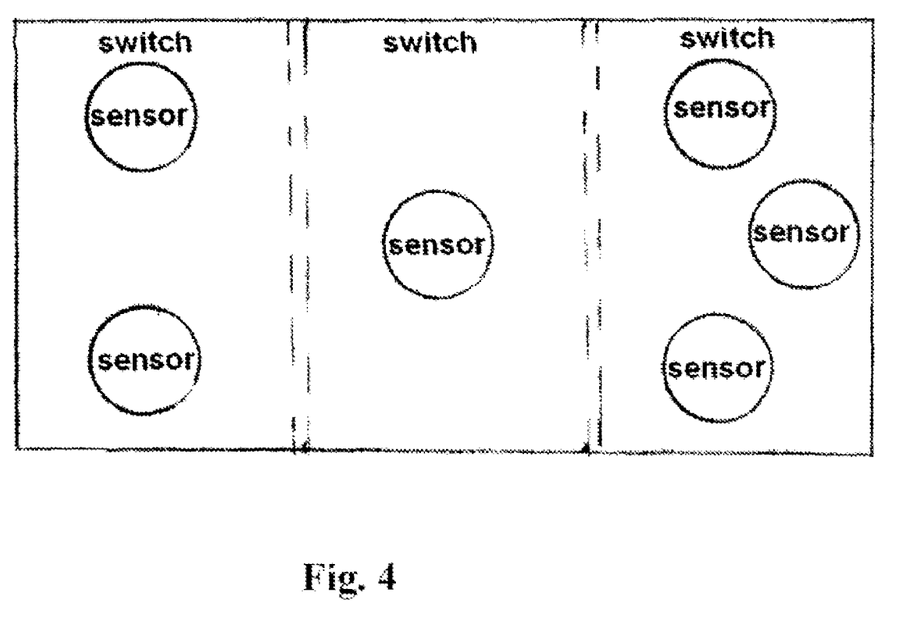
FIG. 4 is a block diagram of an alternative embodiment of the present invention.

Referring to FIG. 4, another embodiment of the present invention is shown, which allows multiple switches to work in close proximity, with the switches having either single or multiple sensors. In practice, if the sensor has a large range, and the switches are mounted in close proximity (like in "ganged" wall boxes), sensor ranges could overlap. FIG. 3a shows such an overlapping area, labeled 'overlap'. For example, if an object would enter this area, both switches would be activated. This would make operating only a single switch very difficult. To overcome this, the sensor switches communicate with each other, as discussed above. In this way, each switch can compare the state of the neighboring switch and decide which switch sensor has the larger signal relative to the neighboring switch sensors. Only the switch with the larger output signal would trigger its respective switch, the other switches would be blocked from operating, including when the sensor output would otherwise be high enough to trigger the switch. The areas of activation would therefore not overlap, as shown in FIG. 3b, yet there is still complete coverage in front of the switches.

The switches can additionally be programmed to "predict" or even "learn" a users' intentions, based on information derived from the neighboring switch sensors. For example, when a user seeks to activate a middle switch by holding the hand on the middle switch, but, because the switches are close together, part of the users' hand reaches in the neighboring sensor ranges. If there were no communication, the other switches would activate as well. But if the sensor information from all the neighboring sensors is considered, a processing unit can decide or even learn from past experience that only the middle switch or an adjacent switch, which has the strongest signal, was meant to be activated and override the operation of the nearby switches.

Additionally, specific hand movements can be designated to perform a specific function, such as moving in/out along the Z axis twice may mean to turn on a specific series of lights, as opposed to one light, or to return to a prelearned dimmer setting preferred by the user.

Figure 5:
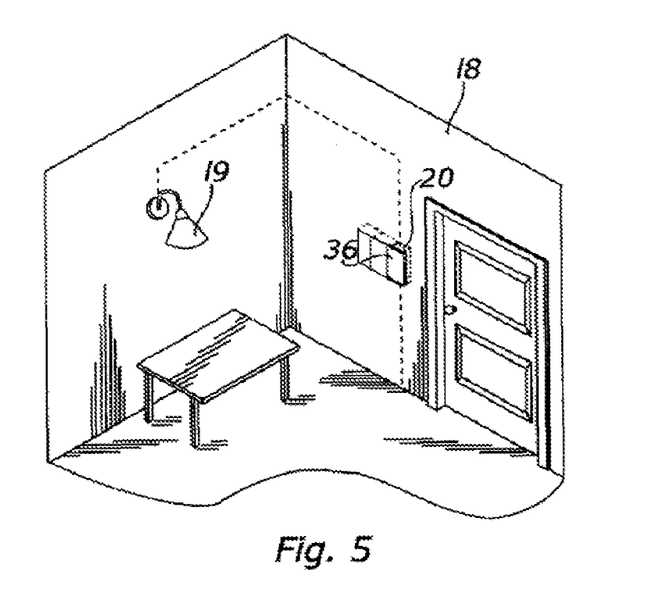
FIG. 5 is a view illustrating operation of a room light in accordance with the present invention.
Figure 6:
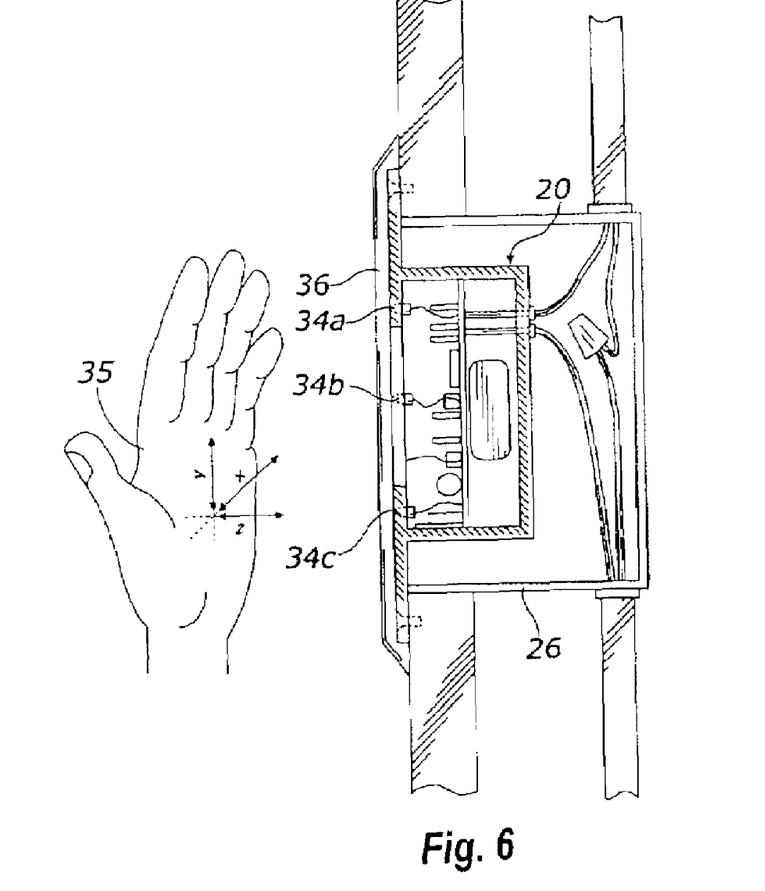
FIG. 6 is a cross section view showing the integral non-contact switch mounted in a switch electrical box.
Figure 7A:
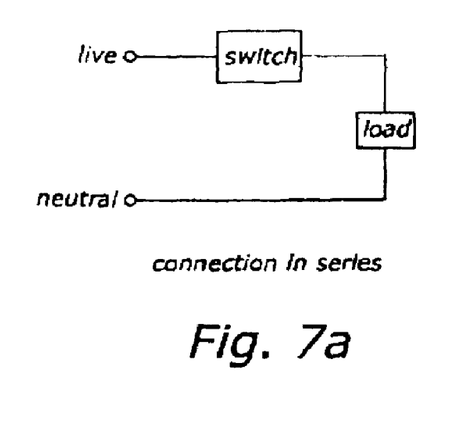
FIGS. 7a and 7b are views showing the inventive switch with series and parallel connections.
Figure 7B:
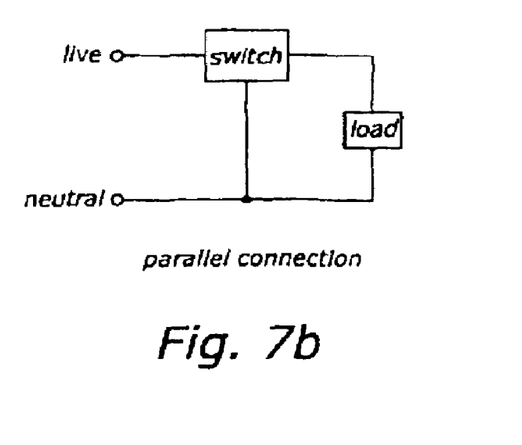

A view illustrating operation in a room 18 of a light 19 using a switch 20 in accordance with the present invention is shown in FIG. 5. The switch 20 is covered by a cover plate 36. FIG. 6 is a cross section view showing the switch 20 mounted in a typical wall box 26, the switch activated by a hand 35 located in front of the cover plate, and as discussed previously, hand movements are sensed by sensors associated with the switch 20. Light sources 34a, 34b and 34c are disposed behind the cover plate 36. FIGS. 7a and 7b are views showing the switch 20 with a series connection and a parallel connection, respectively, the embodiment of FIGS. 8a and 8b incorporating an air gap switch, which is discussed further below.

Optionally, in another embodiment, the CPUs in the switches can be programmed to "predict" or even "learn" user intentions, based on extra information from neighboring sensors. For example, given past actions by a hand in front of the switches, the CPU can determine that present movements correspond to particular commands. For example, movements of the hand and positions of the hand can be programmed for activating particular functions, i.e., up for increasing power, down for decreasing power, left to right to activate a second circuit, right to left, to deactivate the second circuit, etc Various methods can be used for inter-switch communication. They include but are not limited to: wire connection, galvanically insulated wire connection, via optocoupler or signal transformer, wireless, IR or radio frequency, TCP/IP, LAN, Bluetooth, etc.

In some cases it is useful to control the switch via a remote control device or to exchange information between switches. Such systems are becoming more practical and are being considered for or included in new "smart" construction buildings. This may utilize special communication wire connecting all communicating devices, or more preferably use the existing AC power lines to exchange information between the switch and a central control unit or between switches. The inventive switch can be integrated into such systems and be programmed and/or controlled via this communication or simply could send information on status. Various protocols and method of transmitting/receiving the information between units via the AC power line could be used. Wireless methods, such as using radio or IR communication could also be used for transmissions between units, though dedicated wiring could also be used.

Figure 9A:
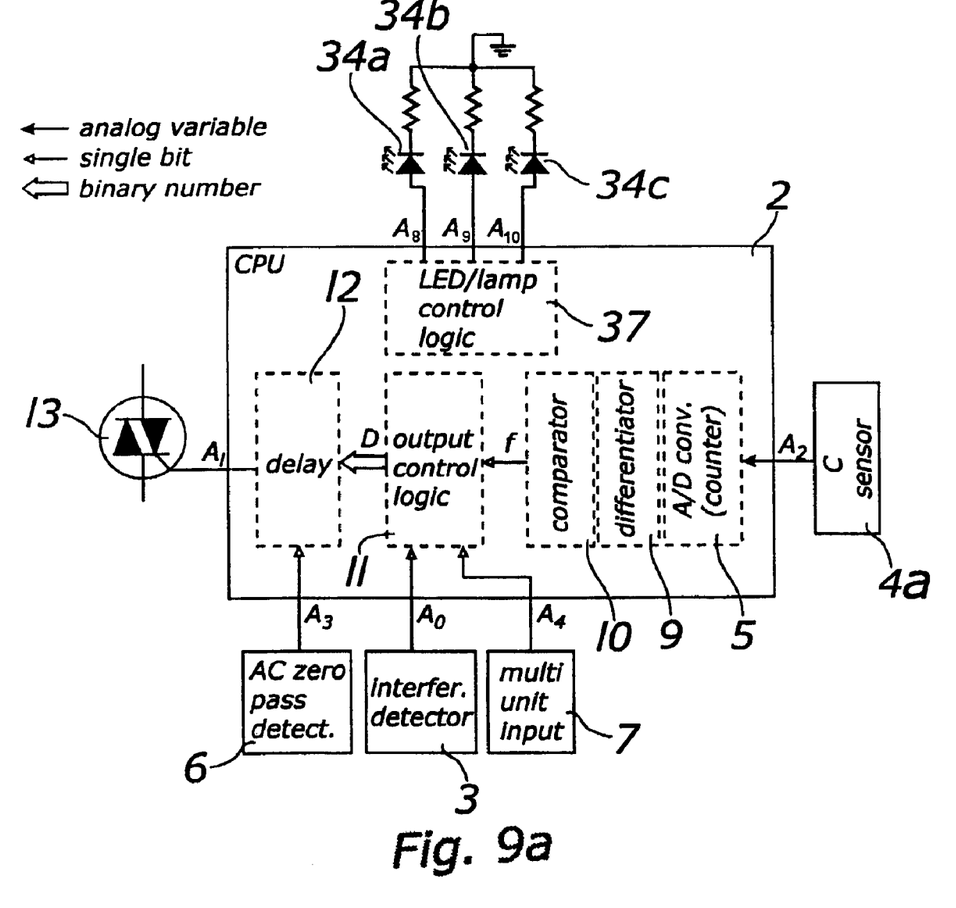
FIGS. 9*a*-9*d* are views of yet another embodiment of the invention, incorporating lamp control logic.
Figure 9B:
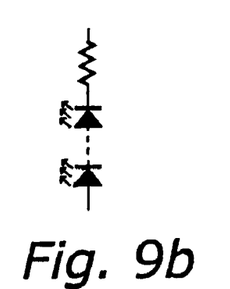
Figure 9C:
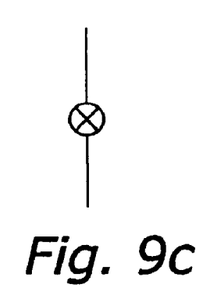
Figure 9D:
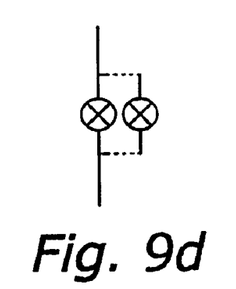

FIG. 9a is a block diagram of an alternative embodiment of the invention. The CPU 2 has a control block 37 that calculates control signals for three light sources 34a, 34b, 34c, which in this case are LED's. These control signals can be calculated using data from other information processed or accessible in the CPU 2, such as the A/D output, output control logic, X, Y and/or Z position of the hand etc. or without any reference to the internal states of the CPU. The control signals are supplied via outputs $A_8, A_9, A_{10}$ the control signals determining if power is to be applied to each individual LED and/or light bulb, and so determining the light source to be illuminated and/or the brightness, which can be varied by a signal on a corresponding control output. Many light sources, such as LED's and/or light bulbs can be connected to a single output. FIG. 9b shows a connection of a group of LED's responsive to a single output. FIG. 9c shows a connection of a single light bulb and FIG. 9d shows a connection of a group of light bulbs responsive to a single output. Of course, mixed connections of light bulbs with LED's, or groups of both are possible. Also, while three LED or/and light bulb control outputs $A_8$ to $A_{10}$ and three LED's 34a, 34b and 34c are shown on FIG. 9a, a different number of outputs, LED's and light bulbs can be used. Separate LED or/and light bulb controllers can also be used.

To summarize, the inventive switch in its most basic form may use means for detecting the presence, position and movement of an object and for generating X, Y and/or Z values corresponding to the objects' position and its movement as a first data bit, a triac (or other semiconductor element or relay) for delivering a control signal to the power control element (triac, transistor, relay) which is a second data bit used to control the power delivered by the switch and an AC zero detector for detecting an AC period zero crossing as a third data bit. Thus a switch with very few components and input/output pin connections can be provided resulting in a compact integral assembly.

The means for detecting is preferably at least two capacitive sensors. The switch also includes a central processing unit for receiving and processing the X, Y and Z values corresponding to the objects' position and its movement as a first data bit, to generate the delayed triac trigger pulse, or another appropriate signal as a second data bit to control another kind of semiconductor element, relative to the AC period crossing for controlling power supplied to the load. Alternatively, a relay can be used in place of the triac to issue an output as the second data bit for controlling circuit power.

A power supply circuit is readily incorporated as are various additional elements such as A/D converters to convert the sensor outputs to digital values, a differentiator to assure reaction only on capacitive changes, a comparator to calculate X, Y and/or Z coordinates of an object based on relative outputs of sensors, as a first data bit, and a control logic converter where the amount of power to be supplied as a function of the first data bit is calculated relative to the third data bit, among other components. Various algorithms can be incorporated in the central processing unit for determining the on/off character of the switch and/or dimming function.

Figure 8A:
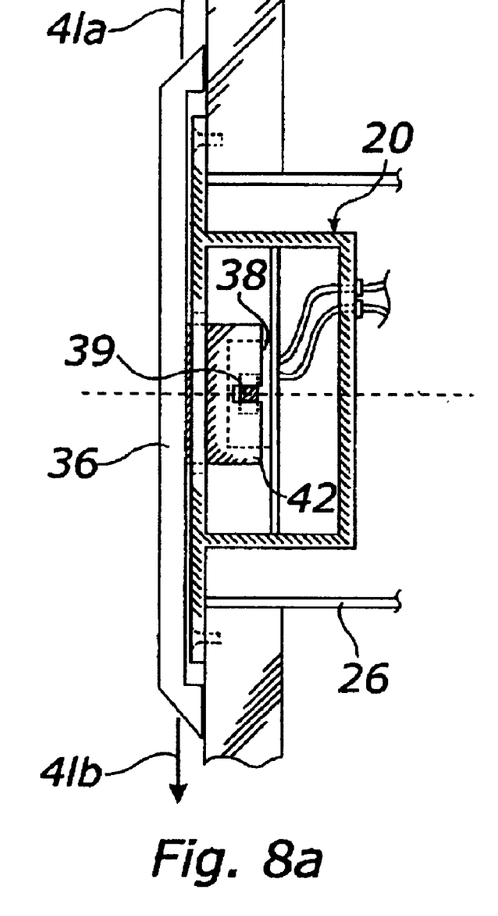
FIGS. 8*a* and 8*b* are views of the inventive switch in an embodiment incorporating an air gap switch.
Figure 8B:
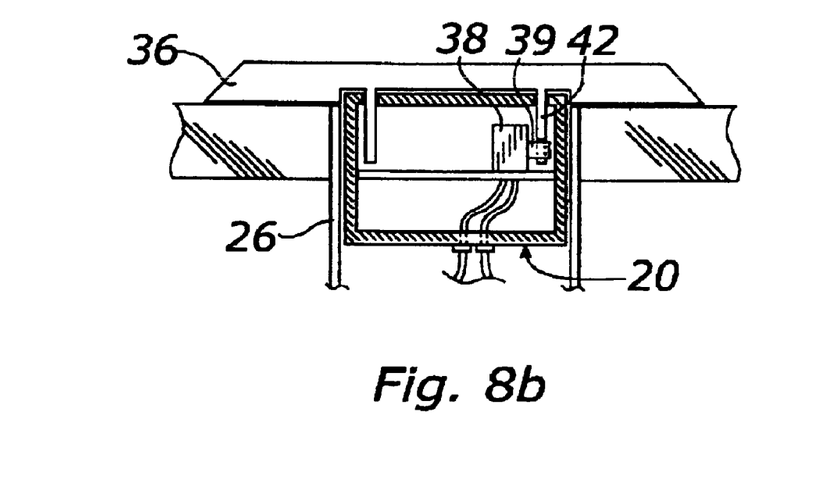

Preferably, an air gap switch having a removable cover plate 36 is used to halt power to the circuit, as illustrated in FIGS. 8a and 8b. This can be used with other switches besides the one described herein. The air gap switch has a cover plate 36 with means to engage a disconnect switch 38 having a lever 39 incorporated into the power supply circuit. The cover plate is mounted for movement such as sliding up 41a or down 41b to toggle the a lever type disconnect switch, the cover plate having an arm 42 for activating the lever 39, or is mounted for being pulled in or out to toggle a push button type of disconnect switch. In addition, an inventive lighting system for use with cover plates may be integrated with the inventive switch 20, though that can also be used with other switches, other electrical components or even as a stand alone unit. This lighting system would incorporate a light supply, as illustrated in FIG. 6, means to connect to a power source, a mounting assembly for supporting a light supply and the power source behind a cover plate and a controller for controlling the light supply such as turning the light supply on/off, initiating a particular sequences of lighting a single LED/Bulb or multiple light sources that compose the light supply, as well as the intensity of the light supply, FIG. 6 illustrating the use of three LED's as the light source. This lighting system can be integrated with many different electrical components, or be integrated with a cover plate, or be a stand alone lighting product mounted in wall receptacles with or without electrical components. For example, these can provide an aesthetic effect such as for outlining a picture mounted on the wall or providing illumination through various cover plates visible across a room. The light supply can be responsive to power flow as discussed above, or produce a programmed lighting sequence or intensity to attract attention or be connected to external controllers for activating the switch and/or operation. For example, connection to a computer in a "smart" building may provide for activation at certain times of the day or when other lights are deactivated to provide a substitute for full room lighting, to act as a night light, emergency light, warning light, etc.

The inventive switch may further be engaged with an air gap switch, a movable cover plate engaged to the air gap switch for activating the air gap switch to halt power supply to the electrical circuit of the inventive switch, the cover plate having means to engage the air gap switch. In one embodiment, the cover plate is movable to toggle a lever disconnect switch, the cover plate having an arm for activating the lever. In another embodiment, the cover plate is movable for being pulled in or out to toggle a push button disconnect switch. The inventive switch may further comprise a remotely located controller (44, FIG. 2c) in communication with the switch for remotely activating or operating the switch. The inventive switch may be connectable to a "smart home" system controller (45, FIG. 2c), the controller communicating with the switch and capable of sending control signals to the switch. The switch may further comprise a separate input A4, received via the multiunit block 7, for control by a slave non-contact type sensor unit. In another embodiment, the invention includes a lighting system for use with an electrical switch (as described relative to FIGS. 6 and 9a) mounted in a wall box (as shown in FIG. 6) and having an electrical circuit passable therethrough, the lighting system comprising at least one light source, means to connect to a power supply integrated with the electrical circuit, a mounting assembly for supporting the light source and the power supply and a controller for controlling the light source integrated with the electrical switch (see FIG. 9a), the electrical switch having one or more sensors and means for communicating with nearby electrical switches whereby the light source is turned on and off, or a sequence of lighting of a single light source or multiple light sources is initiated or an intensity of the light source is varied.

While preferred embodiments of the present invention have been shown and described, it will be understood by those skilled in the art that various changes or modifications can be made without varying from the scope of the present invention.

I claim:

1. A non-contact multi-function electrical switch for use in at least one electrical circuit for controlling at least one electrical device comprising:
   one or more sensor means;
   a central processing unit (CPU) connected to the one or more sensor means and having means for receiving input signals therefrom, and for processing the signals to generate one or more output signals in response to the input signals, the central processing unit having signal processing means for receiving the one or more output signals and for determining which function is to be performed, the signal processing means generating one or more control signals in response to the output signals, the control signals received by means for performing the function identified by the signal processing means in the at least one electrical circuit, and a comparator to calculate X, Y and/or Z coordinates of an object based on outputs of two or more sensor means, and,
   means for communicating with neighboring switches.

2. The switch of claim 1 wherein the sensor means are capacitive sensors.

3. The switch of claim 1 further comprising an AC period zero cross detector and one or more triac's or other semiconductor elements, wherein the semiconductor elements are transistors or a relay located in the electrical circuit and wherein at least one control signal is a delayed triac trigger pulse for controlling power supplied to the at least one electrical circuit, or wherein the semiconductor devices are level driven instead of delayed pulse driven.

4. The switch of claim 1 further comprising a relay in the electrical circuit, wherein at least one control signal activates the relay for controlling power in the electrical circuit.

5. The switch of claim 1 further comprising one or more A/D converters to convert one or more signals from the sensor means to a digital value.

6. The switch of claim 1 further comprising a differentiator for receiving the signals from the sensor means and for transmitting the signals only on a change in a presence before the switch.

7. The switch of claim 1 wherein the signal processing means is a control logic component where the function to be performed is determined as a function of the one or more output signals.

8. The switch of claim 1 further comprising a delay counter synchronized with an AC period via an AC period zero cross detector, to generate a time delay proportional to at least one output signal after an AC period zero crossing.

9. The switch of claim 1 wherein at least one control signal varies the power in the electrical circuit to provide a dimmer function.

10. The switch of claim 1 further comprising a power supply for the switch.

11. The switch of claim 10 wherein the power supply comprises a semiconductor element coupling a capacitor directly to a line voltage, such that when the line voltage is below a certain level, the capacitor is charged.

12. The switch of claim 11 further comprising a regulator connected to the capacitor to regulate the line voltage.

13. The switch of claim 1 further comprising an air gap switch engaged with the non-contact multi-function electrical switch, a movable cover plate engaged to the air gap switch for activating the air gap switch to halt power supply to the electrical circuit.

14. The switch of claim 13 wherein the cover plate has means to engage the air gap switch.

15. The switch of claim 13 wherein the cover plate is movable to toggle a lever disconnect switch having a lever, the cover plate having an arm for activating the lever.

16. The switch of claim 1 further comprising means for lighting integrated with the switch.

17. The switch of claim 1 wherein the communication means are selected from the group consisting of dedicated wires, a galvanically insulated connection, infrared transmitters/receivers, radio transmitters/receivers, wireless communicator devices and combinations thereof.

18. The switch of claim 1 wherein the communication means establish communication via a common bus.

19. A non-contact multi-function electrical switch for use in at least one electrical circuit for controlling at least one electrical device comprising:
one or more sensor means;
a central processing unit (CPU) connected to the one or more sensor means and having means for receiving input signals therefrom, and for processing the signals to generate one or more output signals in response to the input signals, the central processing unit having signal processing means for receiving the one or more output signals and for determining which function is to be performed, the signal processing means generating one or more control signals in response to the output signals, the control signals received by means for performing the function identified by the signal processing means in the at least one electrical circuit, and,
means for communicating with neighboring switches, the communication means enabling the CPU to perform sensor synchronization, to eliminate overlap zones and to program the switch to perform complex functions.

20. The switch of claim 1 further comprising a remotely located controller in communication with the switch for remotely activating or operating the switch.

21. The switch of claim 1 wherein the switch is connectable to a "smart home" system controller, the controller communicating therewith and capable of sending control signals thereto.

22. The switch of claim 1 further comprising a separate input for control by a slave non-contact sensor unit.

23. The switch of claim 1 further comprising an interference detector to improve noise immunity.

24. The switch of claim 1 wherein the processing unit has a software algorithm to improve noise immunity.

25. A non-contact multi-function electrical switch for use in at least one electrical circuit for controlling at least one electrical device comprising:
two or more sensor means; and,
a central processing unit (CPU) connected to the sensor means and having means for receiving signals therefrom, and for processing the signals to generate one or more output signals, and having signal processing means for receiving the one or more output signals and for determining which functions are to be performed, the signal processing means generating one or more control signals in response to the sensor signals, the control signals received by means for performing the function identified by the signal processing means in the at least one electrical circuit, such that movements in different directions can be processed to effect a plurality of control functions, the central processing unit having a comparator to calculate X, Y and/or Z coordinates of an object based on the sensor signals received from two or more sensor means.

26. The switch of claim 25 wherein the sensor means are capacitive sensors.

27. The switch of claim 25 wherein at least one control signal varies the power in the electrical circuit to provide a dimmer function.

28. The switch of claim 25 further comprising an air gap switch engaged with the non-contact multi-function electrical switch, a movable cover plate engaged to the air gap switch for activating the air gap switch to halt power supply to the electrical circuit.

29. A lighting system for use with an electrical switch mounted in a wall box and having an electrical circuit passable therethrough, the lighting system comprising at least one light source, means to connect to a power supply integrated with the electrical circuit, a mounting assembly for supporting the light source and the power supply and a controller for controlling the light source integrated with the electrical switch, the electrical switch having one or more sensors and means for communicating with nearby electrical switches whereby the light source is turned on and off, or a sequence of lighting of a single light source or multiple light sources is initiated or an intensity of the light source is varied, wherein communication is used for sensor synchronization, to eliminate overlap zones and to program the switches to perform complex functions.

30. The lighting system of claim 29 wherein an intensity of the light source is varied in response to power flow through the electrical circuit.

31. The lighting system of claim 29 wherein the light source controller is programmed to generate a lighting sequence or an intensity to attract attention.

32. A multi-gang switch arrangement comprising a plurality of switches mounted next to each other, each of the switches having one or more sensors, the sensors from the plurality of switches providing an array, the array of sensors generating a plurality of sensor outputs wherein different combinations of sensor outputs generated by the array actuate different functions, and, a processing unit for receiving the plurality of sensor outputs for performing the different functions, the processing unit used for sensor synchronization, to eliminate overlap zones and to perform complex functions.

33. The multi-gang switch arrangement of claim 32 further comprising means for establishing communication between the first plurality of switches.

34. The multi-gang switch arrangement of claim 33 wherein one or more of the switches are in communication with each other and/or with the processing unit.

35. A multi-gang switch unit comprising two or more switches, each of the switches having one or more sensors, the switches being connected together to provide a unit with multiple sensors for covering a larger sensor area capable of detecting and processing output signals received from the multiple sensors, for performing sensor synchronization, to eliminate overlap zones and to program the switches to perform complex functions.

36. The multi-gang switch unit of claim 35 wherein two or more of the switches are in communication with each other.

37. The multi-gang switch unit of claim 35 wherein the switches are connected to each other through use of means selected from the group consisting of dedicated wires, a galvanically insulated connection, infrared transmitters/receivers, radio transmitters/receivers, wireless communicator devices and combinations thereof.

38. The multi-gang switch arrangement of claim 35 wherein connection is established via a common bus.

39. A multi-gang switch unit comprising two or more switches, each of the switches having one or more sensors, the switches being in communication with each other to provide a unit with multiple sensors for covering a larger sensor area capable of detecting and processing output signals received from the multiple sensors, communication used for sensor synchronization, to eliminate overlap zones and to program the switches to perform complex functions.

* * * * *